(12) United States Patent
Kataoka

(10) Patent No.: US 9,761,301 B2
(45) Date of Patent: Sep. 12, 2017

(54) MEMORY CONTROL CIRCUIT FOR CONTROLLING MEMORY DEVICE THAT OPERATES IN SELF-REFRESH MODE, AND METHOD OF CONTROLLING THE SAME

(71) Applicant: CANON KABUSHIKI KAISHA, Tokyo (JP)

(72) Inventor: Junnosuke Kataoka, Toride (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/243,170

(22) Filed: Aug. 22, 2016

(65) Prior Publication Data

US 2017/0062041 A1    Mar. 2, 2017

(30) Foreign Application Priority Data

Aug. 26, 2015  (JP) ................... 2015-167004

(51) Int. Cl.
| | |
|---|---|
| *G11C 11/4076* | (2006.01) |
| *G11C 11/4096* | (2006.01) |
| *G06F 13/16* | (2006.01) |
| *G11C 11/4074* | (2006.01) |
| *G11C 5/14* | (2006.01) |
| *G11C 11/406* | (2006.01) |
| *G11C 11/4072* | (2006.01) |

(52) U.S. Cl.
CPC ...... *G11C 11/4096* (2013.01); *G06F 13/1694* (2013.01); *G11C 5/141* (2013.01); *G11C 11/4072* (2013.01); *G11C 11/4074* (2013.01); *G11C 11/40615* (2013.01)

(58) Field of Classification Search
None
See application file for complete search history.

(56) References Cited

U.S. PATENT DOCUMENTS 7,869,300 B2    1/2011  Bhakta et al.
2010/0278000 A1*  11/2010  Bhakta .................. G06F 1/3225
                                            365/226

FOREIGN PATENT DOCUMENTS

EP          2246769 A1    11/2010
JP       2010262645 A     11/2010

* cited by examiner

*Primary Examiner* — James G Norman
(74) *Attorney, Agent, or Firm* — Rossi, Kimms & McDowell LLP

(57) ABSTRACT

A memory control circuit capable of holding a memory device in a self-refresh mode even when a memory controller is powered off and then restarted. The controller performs data memory reset processing including deleting data in a buffer of a volatile memory device which operates when supplied with power from a first power supply, by changing an effective memory reset signal after the voltage of a second power supply becomes equal to or higher than a predetermined value. The memory reset signal is masked when an effective mask signal is generated. Whether to keep the data is determined when an event occurs which makes the voltage of the second power supply lower than the reset reference value and the first power supply is on. The memory reset signal is masked by making the mask signal effective when the data is determined to be kept.

10 Claims, 9 Drawing Sheets

MEMORY CONTROL CIRCUIT FOR CONTROLLING MEMORY DEVICE THAT OPERATES IN SELF-REFRESH MODE, AND METHOD OF CONTROLLING THE SAME

BACKGROUND OF THE INVENTION

Field of the Invention

The present invention relates to a memory control circuit for controlling a memory device that operates in a self-refresh mode and a method of controlling the same, and, for example, to a memory control circuit for controlling a volatile memory device, such as an SDRAM.

Description of the Related Art

In a typical computer hardware architecture, a memory device is controlled by a memory controller which controls writing of data into the memory device and readout of the data from the memory device, during normal operation thereof. Some memory devices can operate in a self-refresh mode in which the memory device maintains the stored data even when the memory controller is powered off. Note that the memory device refers to an integrated circuit (IC) memory device chip, and the memory controller refers to an IC memory controller chip.

In a memory device formed by a DDR2-SDRAM, by setting a clock enable (CKE) signal to be input to the memory device to a low level, it is possible to power off the memory controller while holding the memory device in the self-refresh mode. This is because a RESET signal is not input to the DDR2-SDRAM, and hence the DDR2-SDRAM can operate only with a CKE signal when the memory controller is started from the power-off state or returning from the self-refresh mode.

On the other hand, in some of other memory devices, a RESET signal is input. Particularly, in a memory device formed by a DDR3-SDRAM, a RESET signal is input when starting from the power-off state. Therefore, if the memory controller is powered off in the self-refresh mode, it is impossible to hold the self-refresh mode when starting the memory controller after that. That is, this causes a problem that data stored in the memory device in the self-refresh mode cannot be preserved.

As a solution to this problem, there has been proposed a method of operating a memory control circuit including a memory device, a memory controller, a power module, and a reset controller (see e.g. Japanese Patent Laid-Open Publication No. 2010-262645). In this method, the memory controller controls the normal operation of the memory device by applying a clock enable signal to a CKE input of the memory device. This CKE input is further connected to a CKE termination node to which electric power is supplied by the power module such that it has a CKE termination voltage.

With this configuration, a power-down operation for powering down the memory control circuit is performed in such a procedure that the memory controller drives the CKE signal to a low level, the power module powers down the CKE termination voltage, and then the power module powers down the memory controller. On the other hand, the normal operation of the memory control circuit is restarted after the power-down in such a procedure that first, the power module powers up the memory controller, then, the memory controller drives the CKE signal to a low level, and the power module powers up the CKE termination voltage.

According to these procedures, it is guaranteed that the memory device remains in the self-refresh mode after the memory control circuit is powered down until the normal operation is restarted.

However, in the method disclosed in Japanese Patent Laid-Open Publication No. 2010-262645, a memory reset controller as part of the memory controller cannot be powered off, and hence although the memory control circuit can be powered down, it cannot be powered off. This is because if the memory reset controller is powered off, the memory reset signal control becomes unstable, which prevents the memory device from being held in the self-refresh mode, and jeopardizes the integrity of the data stored in the memory device.

SUMMARY OF THE INVENTION

The present invention provides a memory control circuit that makes it possible to hold a memory device, such as a DDR3-SDRAM, in a self-refresh mode even when a memory controller is powered off and then restarted.

In a first aspect of the present invention, there is provided a memory control circuit including a memory controller that performs data memory reset processing including deleting data held in a volatile memory that operates when electric power is being supplied from a first power supply, by changing a memory reset signal which is effective, after a voltage value of a second power supply becomes equal to or higher a predetermined value, comprising a mask circuit that is provided between the volatile memory and the memory controller, for masking the memory reset signal when a mask signal which is effective is input, a determination unit configured to determine whether or not to keep the data, in a case where an event occurs which makes the voltage value of the second power supply lower than the predetermined value, and also the first power supply is on, and an output control circuit configured to, in a case where it is determined by the determination unit that the data is to be kept, cause the mask circuit to mask the memory reset signal by outputting the mask signal made effective to the mask circuit.

In a second aspect of the present invention, there is provided a memory control circuit including a memory controller that performs data memory reset processing including deleting data held in a volatile memory that operates when electric power is being supplied from a first power supply, by changing a memory reset signal which is effective, after a voltage value of a second power supply becomes equal to or higher a predetermined value, comprising a mask circuit that is provided between the volatile memory and the memory controller, for masking the memory reset signal when a mask signal which is effective is input, an output control circuit configured to output the mask signal which is effective to the mask circuit during time in which the voltage value of the second power supply does not reach the predetermined value after the second power supply is turned on, and a restoration unit configured to cause the operation of the memory control circuit to be restored using the data, in a case where the first power supply is on when the voltage value of the second power supply becomes equal to or higher than the predetermined value after the second power supply is turned on.

In a third aspect of the present invention, there is provided a memory control circuit including a memory controller that performs data memory reset processing including deleting data held in a volatile memory that operates when electric power is being supplied from a first power supply, by changing a memory reset signal which is effective, after a voltage value of a second power supply becomes equal to or higher a predetermined value, comprising a determination unit configured to determine whether or not to keep the data, in a case where an event occurs which makes the voltage value of the second power supply lower than the predetermined value, and also the first power supply is on, and a suspension unit configured to, in a case where it is determined by the determination unit that the data is to be kept, cause the memory controller not to output the memory reset signal.

In a fourth aspect of the present invention, there is provided a method of controlling a memory control circuit including a memory controller that performs data memory reset processing including deleting data held in a volatile memory that operates when electric power is being supplied from a first power supply, by changing a memory reset signal which is effective, after a voltage value of a second power supply becomes equal to or higher a predetermined value, comprising masking the memory reset signal when a mask signal which is effective is generated, determining whether or not to keep the data, in a case where an event occurs which makes the voltage value of the second power supply lower than the predetermined value, and also the first power supply is on, and masking the memory reset signal by making the mask signal effective in a case where it is determined that the data is to be kept.

In a fifth aspect of the present invention, there is provided a method of controlling a memory control circuit including a memory controller that performs data memory reset processing including deleting data held in a volatile memory that operates when electric power is being supplied from a first power supply, by changing a memory reset signal which is effective, after a voltage value of a second power supply becomes equal to or higher a predetermined value, comprising masking the memory reset signal when a mask signal which is effective is generated, generating the mask signal which is effective for masking the memory reset signal, during time in which the voltage value of the second power supply does not reach the predetermined value after the second power supply is turned on, and causing the operation of the memory control circuit to be restored using the data, in a case where the first power supply is on when the voltage value of the second power supply becomes equal to or higher than the predetermined value after the second power supply is turned on.

In a sixth aspect of the present invention, there is provided a method of controlling a memory control circuit including a memory controller that performs data memory reset processing including deleting data held in a volatile memory that operates when electric power is being supplied from a first power supply, by changing a memory reset signal which is effective, after a voltage value of a second power supply becomes equal to or higher a predetermined value, comprising determining whether or not to keep the data, in a case where an event occurs which makes the voltage value of the second power supply lower than the predetermined value, and also the first power supply is on, and causing, in a case where it is determined that the data is to be kept, the memory controller not to output the memory reset signal.

According to the present invention, in a memory control circuit that controls the memory device, such as a DDR3-SDRAM, connected thereto, even when the memory controller is powered off and is then restarted, it is possible to hold the memory device in the self-refresh mode.

Further features of the present invention will become apparent from the following description of exemplary embodiments (with reference to the attached drawings).

BRIEF DESCRIPTION OF THE DRAWINGS

FIG. 6 is a flowchart of a hardware operation sequence and a software control process, performed when the memory control circuit appearing in FIG. 1 is powered on.

DESCRIPTION OF THE EMBODIMENTS

The present invention will now be described in detail below with reference to the accompanying drawings showing embodiments thereof.

It should be noted that the present invention is not limited to the embodiment described below, and a combination of all features described in the embodiment is not absolutely essential to the solution of the invention.

Figure 1:
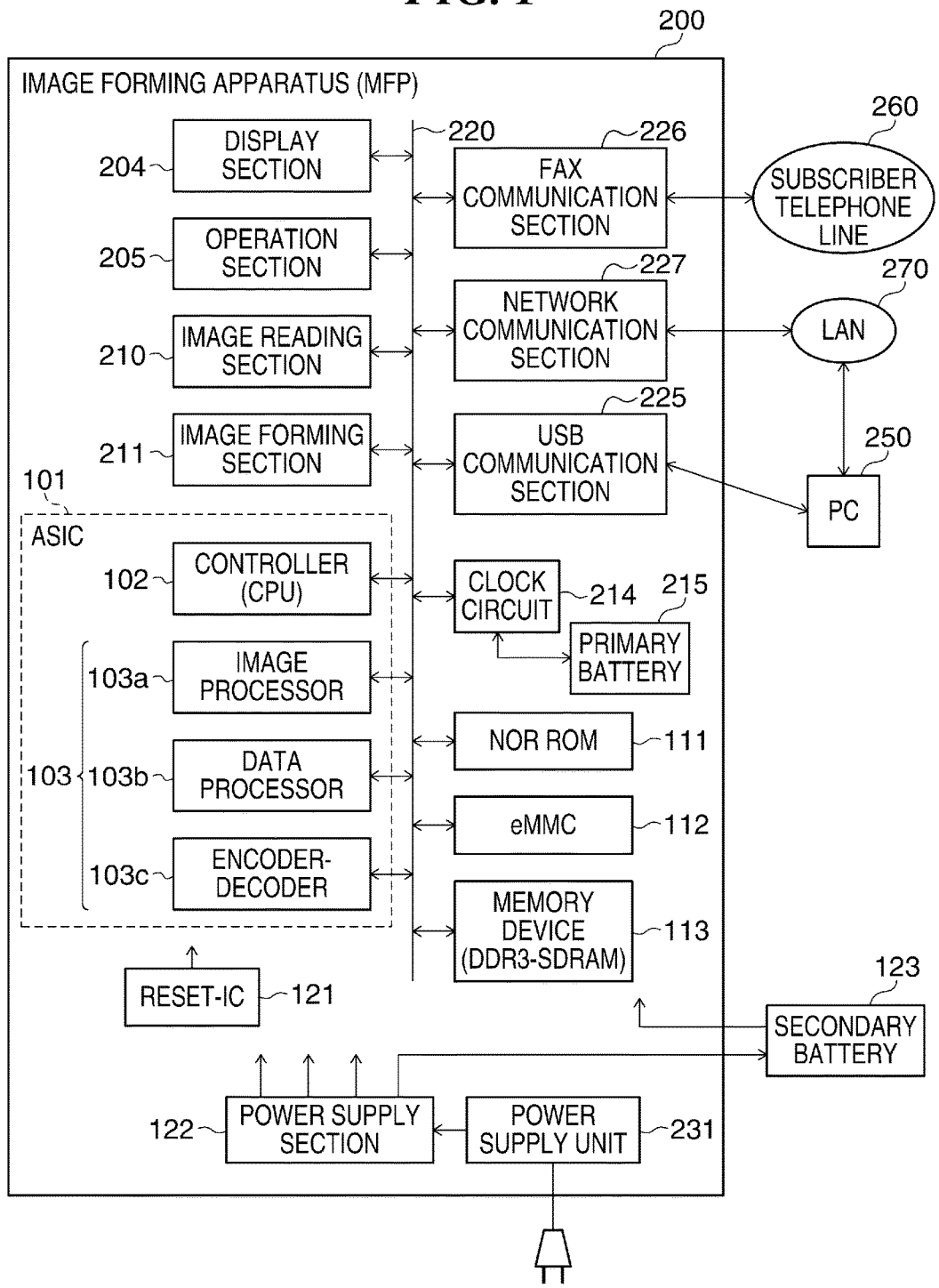
FIG. 1 is a block diagram of the electric configuration of an image forming apparatus including a memory control circuit according to an embodiment of the present invention.

FIG. 1 is a block diagram of the electrical configuration of an image forming apparatus 200 including a memory control circuit according to an embodiment of the present invention. The image forming apparatus 200 is an MFP (Multi-Function Peripheral). Note that the memory control circuit refers to the whole circuit related to a memory driving operation, and is a circuit comprised of an ASIC (Application Specific Integrated Circuit) 101 which is a SOC (System On a Chip), a reset IC 121 (trigger circuit), a delay control circuit 131 (output control circuit), and a gate circuit (mask circuit) 130, described hereinafter with reference to FIGS. 1, 4A, and 4B.

Figure 2:
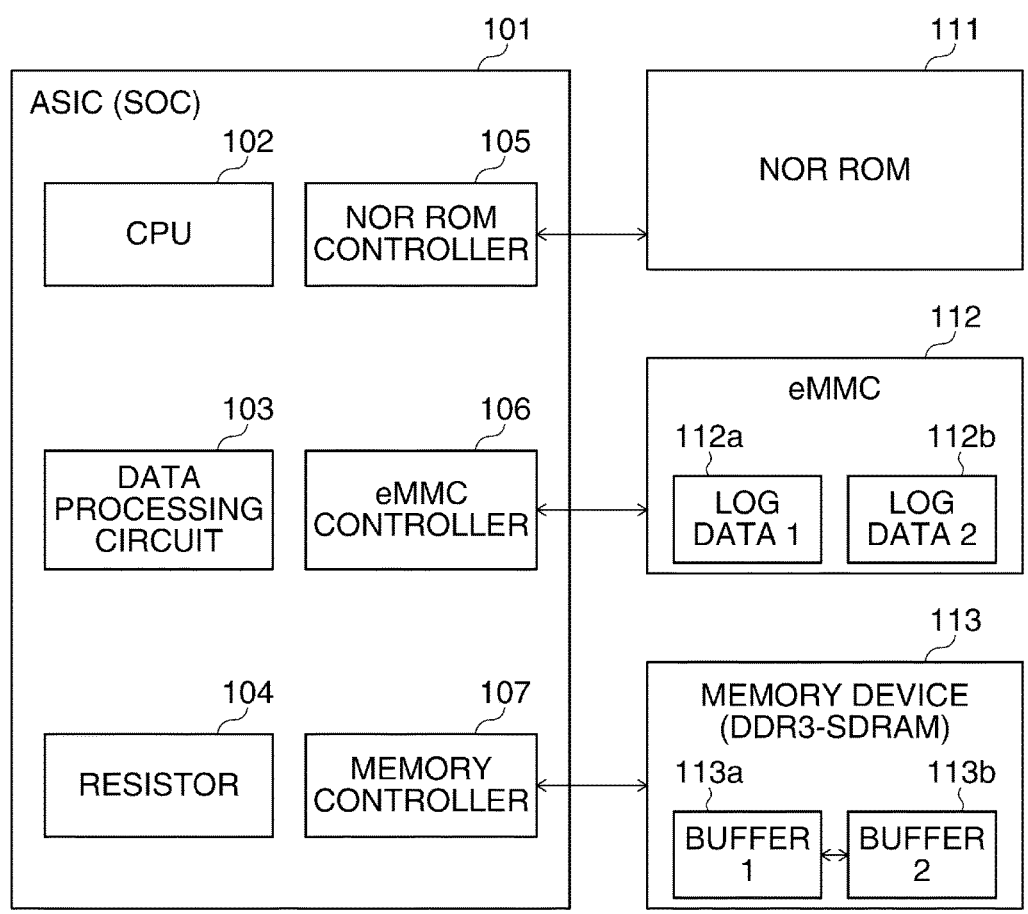
FIG. 2 is a schematic block diagram showing a flow of stored log data in the memory control circuit appearing in FIG. 1.

Referring to FIG. 1, a controller (CPU) 102 controls the overall operation of the image forming apparatus 200, and performs the setting of each processor, and image data input/output control, and so forth. A NOR ROM 111 is a nonvolatile memory formed by a SPI Flash ROM, and stores programs executed by the CPU 102, various data, etc. An eMMC 112 is a nonvolatile memory used as a storage for holding various data, and a work memory for operation, and includes a log data storage area 112a and a log data storage area 112b as shown in FIG. 2. A memory device (DRAM)

113 is a volatile memory formed by a DDR3-SDRAM, and has a double buffer structure formed by a buffer 113a and a buffer 113b as shown in FIG. 2. Programs executed by the CPU 102 are loaded into memory device (DRAM) 113 the under the control of the CPU 102. Further, the memory device 113 is also used as a work area for the CPU 102, a first image memory area for a copy function, a second image memory area for a facsimile function, and an area for temporarily storing log data. A clock circuit 214 outputs time information, and is driven by a primary battery 215. An operation section 205 includes various keys used by a user for operating the image forming apparatus 200, and a display section 204 displays various information for operating the image forming apparatus 200. A FAX communication section 226 performs FAX communication via an analog telephone line (subscriber telephone line) 260. An image reading section 210 is an image reading unit configured to read an original. An image forming section 211 is an image forming unit configured to record and output image data on a recording sheet. In the case of a copy operation, the image forming section 211 records and outputs image data read by the image reading section 210, and in the case of a print operation, records and outputs image data transferred from an external PC 250.

An image processor 103a performs processing for converting a read image and image data to be recorded and output, and a data processor 103b performs processing for converting various data in the system control. An encoder-decoder 103c has a function for encoding image data read by the image reading section 210 using a predetermined method in advance when the image data is transmitted by the FAX communication section 226, and decoding image data received by the FAX communication section 226 using a predetermined method in advance when the image data is printed out. Further, the encoder-decoder 103c has a function for encoding a plurality of pages of image information to temporarily accumulate the image information when the copy operation is performed, and decoding the image information when the image information is printed out. The image processor 103a, the data processor 103b, and the encoder-decoder 103c are hereinafter referred to as a data processing circuit 103 as a whole, on an as-needed basis. Further, the CPU 102 and the data processing circuit 103 form the ASIC 101, described in detail hereinafter with reference to FIG. 2.

The reset IC 121 outputs a trigger signal for controlling a system reset signal supplied to the ASIC 101. The trigger signal will be described in detail with reference to FIGS. 4A and 4B.

A network communication section 227 is a network communication means for receiving image data from the PC 250 to print out the image data, and transferring image data read by the image reading section 210 to the PC 250, via a LAN 270. The network communication section 227 is also used as a remote user interface which is connected from the PC 250 by HTTP connection for a user to operate the image forming apparatus 200 via a browser. A USB communication section 225 is a USB communication means for receiving image data from the PC 250 to print out the image data, and transferring image data read by the image reading section 210 to the PC 250. An internal bus 220 connects the CPU 102, the NOR ROM 111, the eMMC 112, the memory device 113, the operation section 205, the display section 204, the FAX communication section 226, the network communication section 227, the image reading section 210, the image processor 103a, the data processor 103b, the encoder-decoder 103c, the image forming section 211, the USB communication section 225, and the clock circuit 214. The internal bus 220 is comprised of an address bus for transferring address signals, a control bus for transferring control signals, and a data bus for transferring various data.

A power supply unit 231 can be on-off controlled by a user's operation, and when the power supply unit 231 is on, the power supply unit 231 converts electric power supplied from an external commercial AC power supply to a DC power, and supplies the DC power to a power supply section 122. The power supply section 122 converts the DC power supplied from the power supply unit 231 to power supply voltages required by the above-mentioned electronic circuits of the image forming apparatus 200, respectively, and supplies the power supply voltages to them, respectively. A secondary battery 123 is a rechargeable battery for supplying a Vdd_DRAM power 202 (first power supply) to the memory device 113 when the power supply unit 231 is turned off, and may be removably connected. The secondary battery 123 is charged with a Vdd power 201 (second power supply) supplied from the power supply section 122 when the power supply unit 231 is on.

FIG. 2 is a schematic block diagram showing a flow of stored log data in the memory control circuit according to the embodiment of the present invention.

Referring to FIG. 2, the ASIC 101 is an IC that controls the controller system of the image forming apparatus 200. The ASIC 101 is comprised of the CPU 102, the data processing circuit 103, a resistor 104, a NOR ROM controller 105, an eMMC controller 106, a memory controller 107, and so forth.

Here, log data temporarily stored in the memory device 113 will be described. The log data refers to data recorded during execution of programs. The log data is also used e.g. for analysis of an unexpected operation performed during execution of a program. Therefore, the log data is required to be acquired even in a case where the apparatus is restarted after the power supply unit 231 is once turned off, and therefore, the log data is required to be held in a nonvolatile memory or storage.

Logs which are constantly acquired during execution of programs are recorded in the memory device 113 as a primary storage area at a high speed, and when the primary storage area becomes full, the logs are copied to the eMMC 112 as the storage. The memory device 113 as the primary storage area employs the double buffer structure formed by the buffer 113a (also denoted as buffer 1 in FIG. 2) and the buffer 113b (also denoted as buffer 2 in FIG. 2) to prevent log data from flowing even when processing is performed at a low speed so as not to disturb other processing during an operation for copying data from the memory device 113 to the eMMC 112 (including text expansion and compression). Although the log data stored in the memory device 113 is in a binary format, text expansion and data compression are performed when the log data is stored in the eMMC 112. Although the upper limit of the amount of log data stored in the eMMC 112 can be changed, normally, the amount of data storable in the normal use area is set to the upper limit. When the amount of stored log data reaches the set upper limit, the eMMC 112 deletes the log data, starting with the oldest data.

When an external apparatus acquires log data from the image forming apparatus 200, the log data is acquired via the network (LAN 270) or the USB communication section 225. Therefore, when the CPU 102 transmits the log data to the external apparatus, the CPU 102 limits the transmission band so as not to disturb other job processing. For this reason, it can be assumed that this transmission processing takes approximately several ten seconds or more. Further, the log data stored in the eMMC 112 cannot be deleted during this transmission processing, and hence the upper limit of the amount of log data stored in the eMMC 112 is set to the maximum to thereby prevent the eMMC 112 from becoming full even when the copy operation from the memory device 113 to the eMMC 112 occurs during this transmission processing. After this transmission processing is terminated, the old log data is deleted until the amount of stored log data is reduced to an amount which can be stored in the above-mentioned normal use area when the next log data is written in the eMMC 112. Further, even if this transmission processing has failed for some reason, time-out is caused by an I/F layer (the network communication section 227 and the USB communication section 225) to thereby perform control such that the log data being transmitted is not locked in the eMMC 112 for a long time.

Figure 3:
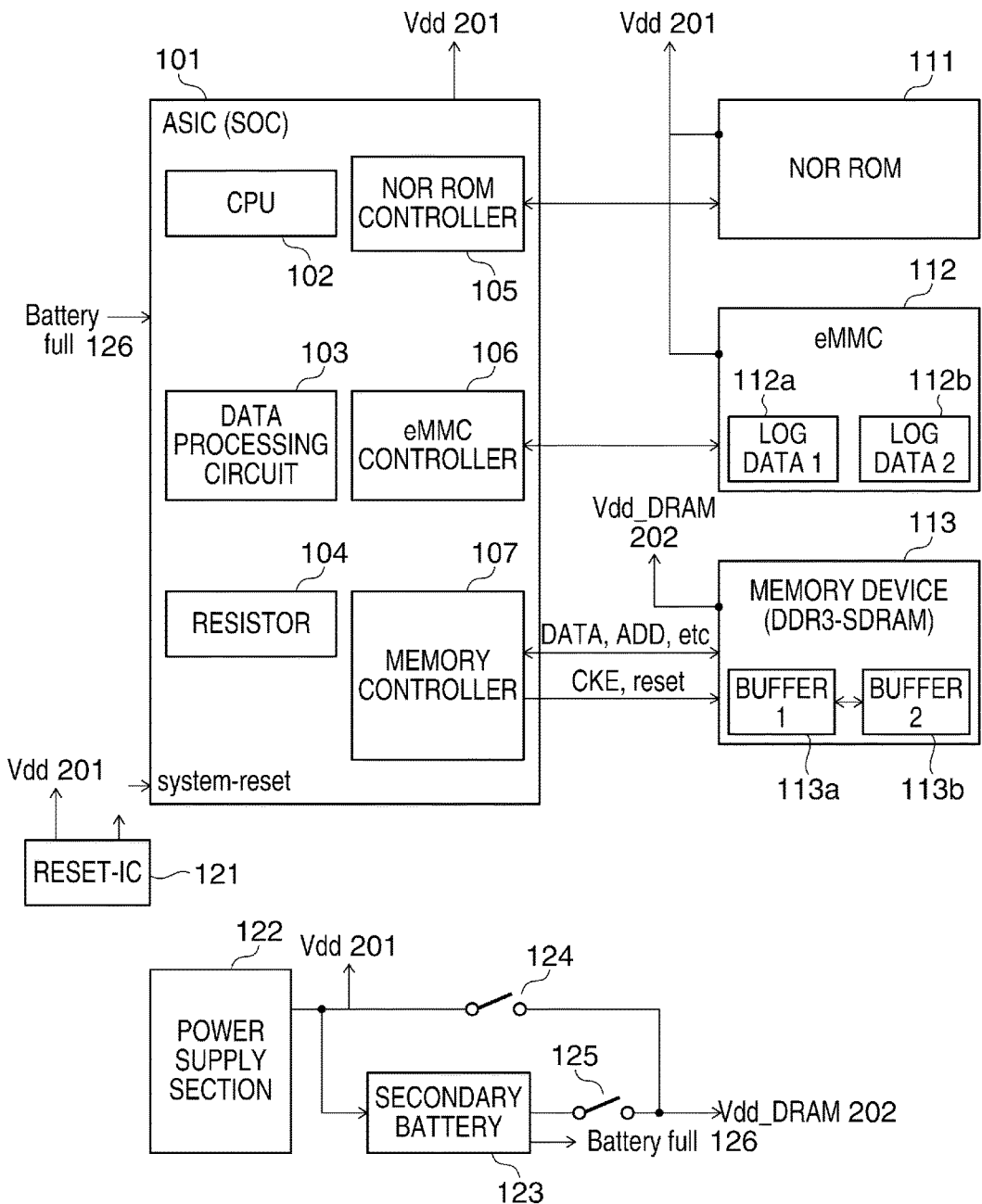
FIG. 3 is a detailed block diagram showing a flow of supplied power to the memory control circuit appearing in FIG. 1.

FIG. 3 is a detailed block diagram showing a flow of supplied power to the memory control circuit according to the embodiment.

Referring to FIG. 3, the Vdd power 201 is supplied to the ASIC 101, and to the CPU 102, the data processing circuit 103, the resistor 104, the NOR ROM controller 105, the eMMC controller 106, and the memory controller 107 in the ASIC 101. Although a plurality of power supply systems, such as a core section and an input/output section, are included the ASIC 101, in the present embodiment, these power supply systems will be collectively described as one system.

Further, similar to the ASIC 101, the Vdd power 201 is also supplied to the NOR ROM 111, the eMMC 112, and the reset IC 121. NOR-ROM is an example of the Flash ROM. The reset IC 121 monitors the voltage of the Vdd power 201, and if the voltage is lower than a predetermined voltage, the reset IC 121 outputs a trigger signal at a low level (effective) to thereby set the signal level of a system reset signal input to the ASIC 101 to low. On the other hand, when the voltage of the Vdd power 201 increases and reaches the predetermined voltage, the reset IC 121 changes the signal level of the trigger signal from low to high (ineffective) to thereby change (deassert) the signal level of the system reset signal input to the ASIC 101 from low to high. That is, the reset IC 121 switches the trigger signal between effective and ineffective according to the voltage of the Vdd power 201.

The Vdd_DRAM power 202 which belongs to a different power supply system from the Vdd power 201 is supplied to the memory device 113. This is because, in the present embodiment, it is necessary to maintain the memory device 113 in a self-refresh state during the supply of power to the memory device 113 even after the Vdd power 201 supplied to the memory controller 107 is turned off.

The power supply section 122 supplies power for the operation of the ASIC 101 and the other electric circuits using a plurality of power supply systems. A plurality of power supply systems are also required to supply power to the ASIC 101. More specifically, a driving power supply voltage of 1.1 V is supplied to drive the CPU 102, a driving power supply voltage of 3.3 V is supplied to drive the NOR ROM 111, and a driving power supply voltage of 1.8 V is supplied to an interface of the eMMC 112. Further, a driving power supply voltage of 1.5 V is supplied to the memory device 113, and a driving power supply voltage of 1.8 V is supplied to a RGMII interface for connecting to the LAN 270, which is included in the network communication section 227. Further, a driving power supply voltage of 3.3 V is supplied to an IO buffer of another IO port.

The secondary battery 123 is a battery for supplying the Vdd_DRAM power 202 to the memory device 113 when the power supply unit 231 is off, and may be removably connected to the power supply section 122. The secondary battery 123 is charged with the Vdd power 201 supplied from the power supply section 122 when the power supply unit 231 is on. At this time, a switch 124 is switched on by the Vdd power 201, whereby the Vdd power 201 is supplied to the memory device 113 as the Vdd_DRAM power 202. When the power supply unit 231 is off, the Vdd power 201 is not supplied from the power supply section 122, and hence the secondary battery 123 starts discharge. At this time, if the secondary battery 123 is sufficiently charged, a battery full signal 126 is output from the secondary battery 123. Upon receipt of the battery full signal 126, a switch 125 is switched on, whereby electric power discharged from the secondary battery 123 is supplied to the memory device 113 as the Vdd_DRAM power 202. The battery full signal 126 is a signal output from the secondary battery 123 in a case where the secondary battery 123 is charged and can supply electric power. On the other hand, in a case where the secondary battery 123 is not sufficiently charged (insufficient remaining charge), or in a case where the secondary battery 123 is not connected (the secondary battery 123 is ineffective), the battery full signal 126 is not output, and the switch 125 is held in the off state.

Here, a memory backup function will be described.

Examples of a method of backing up log data, image data, document management data, etc., at the time of powering off include DRAM backup, NOR ROM backup, and eMMC backup.

DRAM Backup

In the DRAM backup, data to be stored is stored in a RAM Disk (File System) provided in the memory device (DRAM) 113 as a file, and is kept (backed up) in the RAM Disk which is backed up by the secondary battery 123, for a predetermined time period when the power supply unit 231 is turned off.

After that, when the power supply unit 231 is restarted, whether or not the secondary battery 123 is connected and whether or not the secondary battery 123 is sufficiently charged are checked based on the battery full signal 126 output from the secondary battery 123. If it is determined that the secondary battery 123 is not connected or the secondary battery 123 is not sufficiently charged, the memory device 113 is initialized, and normal starting is performed.

If it is determined that the secondary battery 123 is sufficiently charged (effective), the integrity of the data stored in the memory device 113 is checked, and if it is known that the integrity of the data is preserved, the operation is restored using the data stored in the memory device 113. This backup method has a demerit that the secondary battery 123 is required, but is superior in high-speed access.

NOR ROM Backup

In the NOR ROM backup, data to be backed up (kept) when the power supply unit 231 is turned off is stored in the NOR ROM 111. The File System is not provided on the NOR ROM 111. When the power supply unit 231 is restarted, the integrity of the data stored in the NOR ROM 111 is checked, and if it is known that the integrity of the data is preserved, the job is restored using the data stored in the NOR ROM 111. The NOR ROM 111 is a nonvolatile memory, and has a merit that the secondary battery 123 is not required because the stored data is preserved even when power is not supplied thereto, but is disadvantageous in capacity and costs, and is inferior in high-speed access.

eMMC Backup

In the eMMC backup, data to be backed up when the power supply unit 231 is turned off is stored in the eMMC 112.

When the power supply unit 231 is restarted, the integrity of the data stored in the eMMC 112 is checked, and if it is known that the integrity of the data is preserved, the job is restored using the data stored in the eMMC 112. The eMMC 112 is a nonvolatile memory, and has a merit that the secondary battery 123 is not required because the stored data is preserved even when power is not supplied thereto, but is inferior in high-speed access. Further, logs which are constantly acquired during execution of programs are recorded in the memory device 113 as the primary storage area at a high speed, and when the memory device 113 becomes full, the logs are copied to the eMMC 112 as the storage. Therefore, this backup method has a problem that even in a case where log data is desired to be acquired because of a faulty operation, if the power supply unit 231 is turned off before the last log data is copied from the primary storage area (memory device 113) to the storage (eMMC 112), the log data desired to be acquired cannot be acquired by this backup method.

Figure 4A:
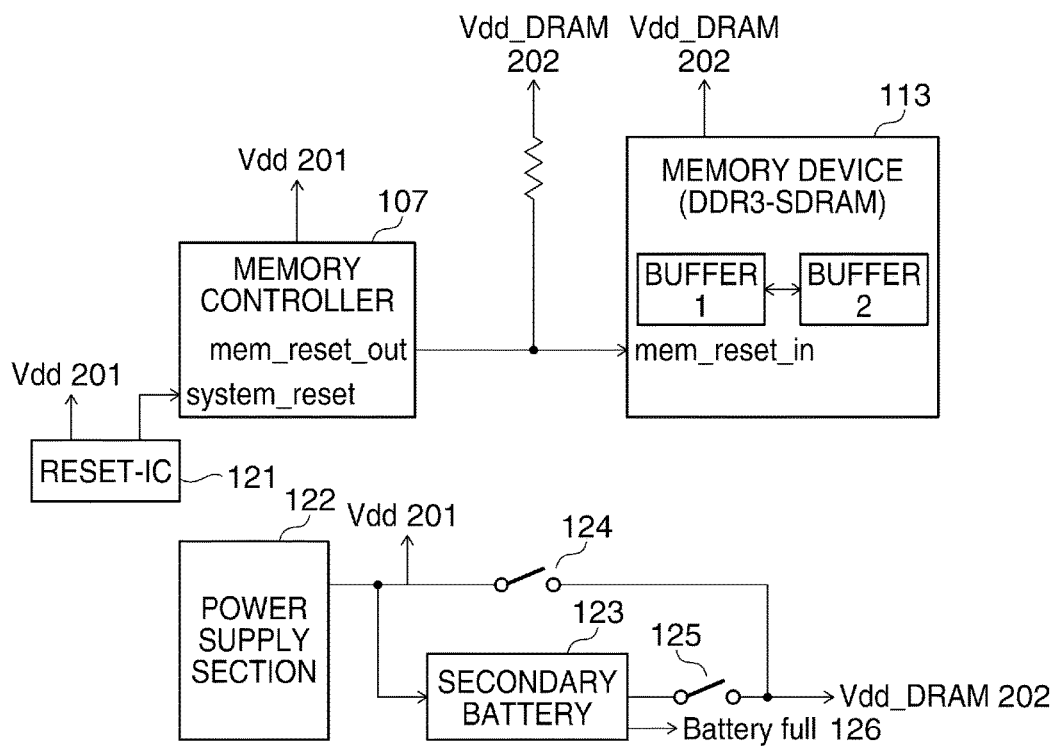
FIG. 4A is a detailed block diagram useful in explaining signal processing performed during operation of a memory controller of a conventional example.
Figure 4B:
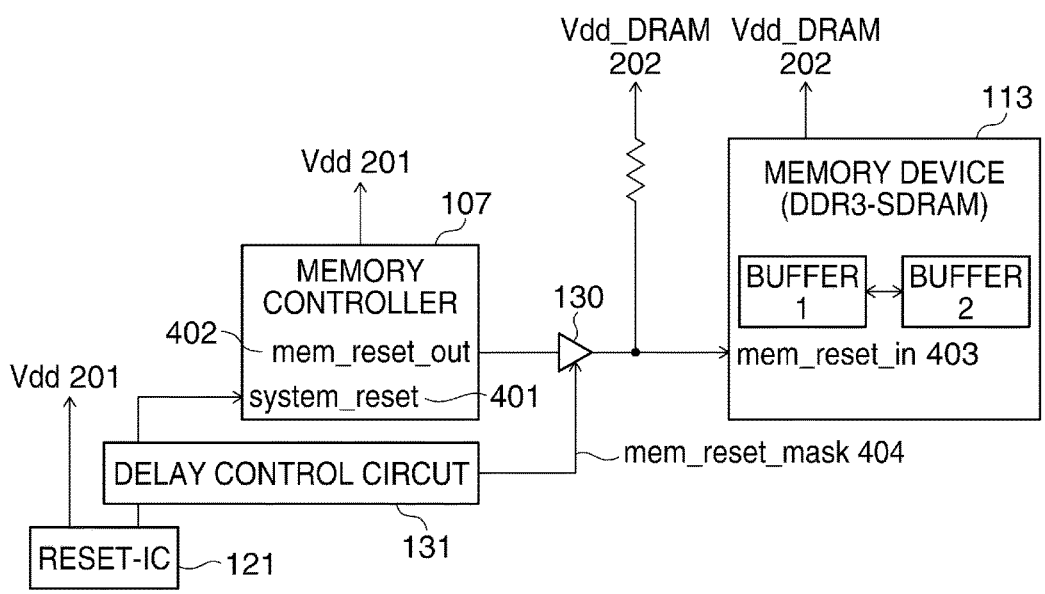
FIG. 4B is a detailed block diagram useful in explaining signal processing performed during operation of a memory controller appearing in FIG. 2.

FIG. 4A is a detailed block diagram useful in explaining signal processing performed during operation of a memory controller of a conventional example. FIG. 4B is a detailed block diagram useful in explaining signal processing performed during operation of the memory controller 107 appearing in FIG. 2.

Figure 5A:
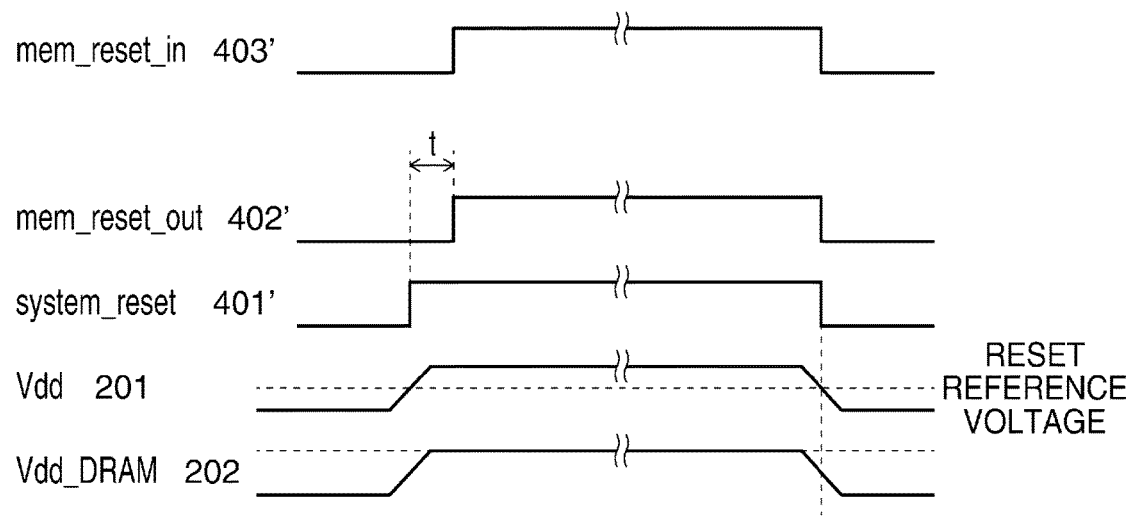
FIG. 5A is a timing diagram useful in explaining signal processing performed during operation of the memory controller of the conventional example.
Figure 5B:
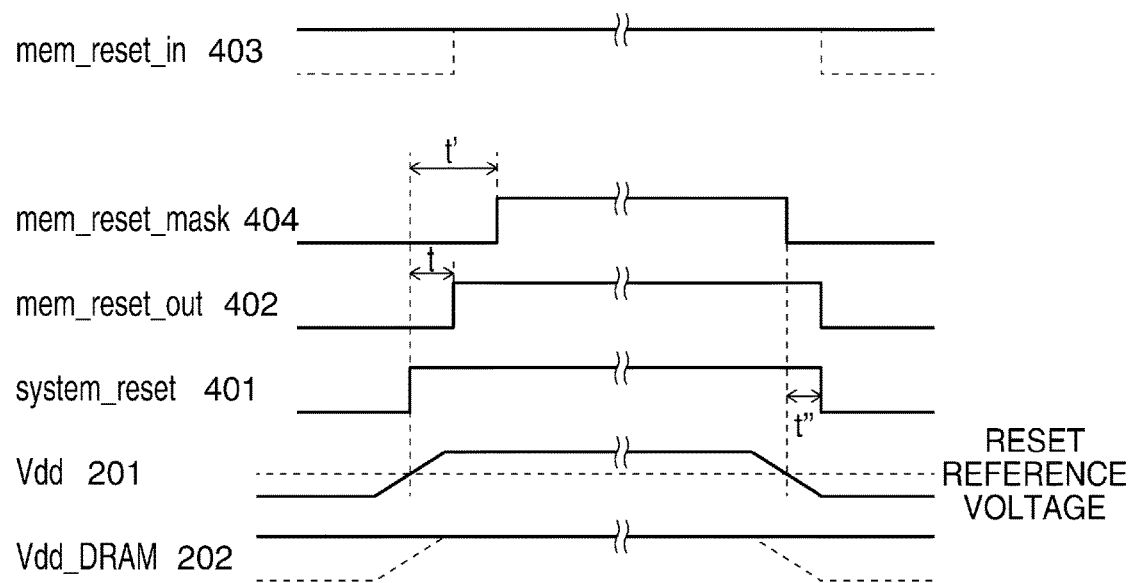
FIG. 5B is a timing diagram useful in explaining signal processing performed during operation of the memory controller appearing in FIG. 2.

FIG. 5A is a timing diagram useful in explaining signal processing performed during operation of the memory controller of the conventional example, and FIG. 5B is a timing diagram useful in explaining signal processing performed during operation of the memory controller 107 appearing in FIG. 2.

Figure 6:
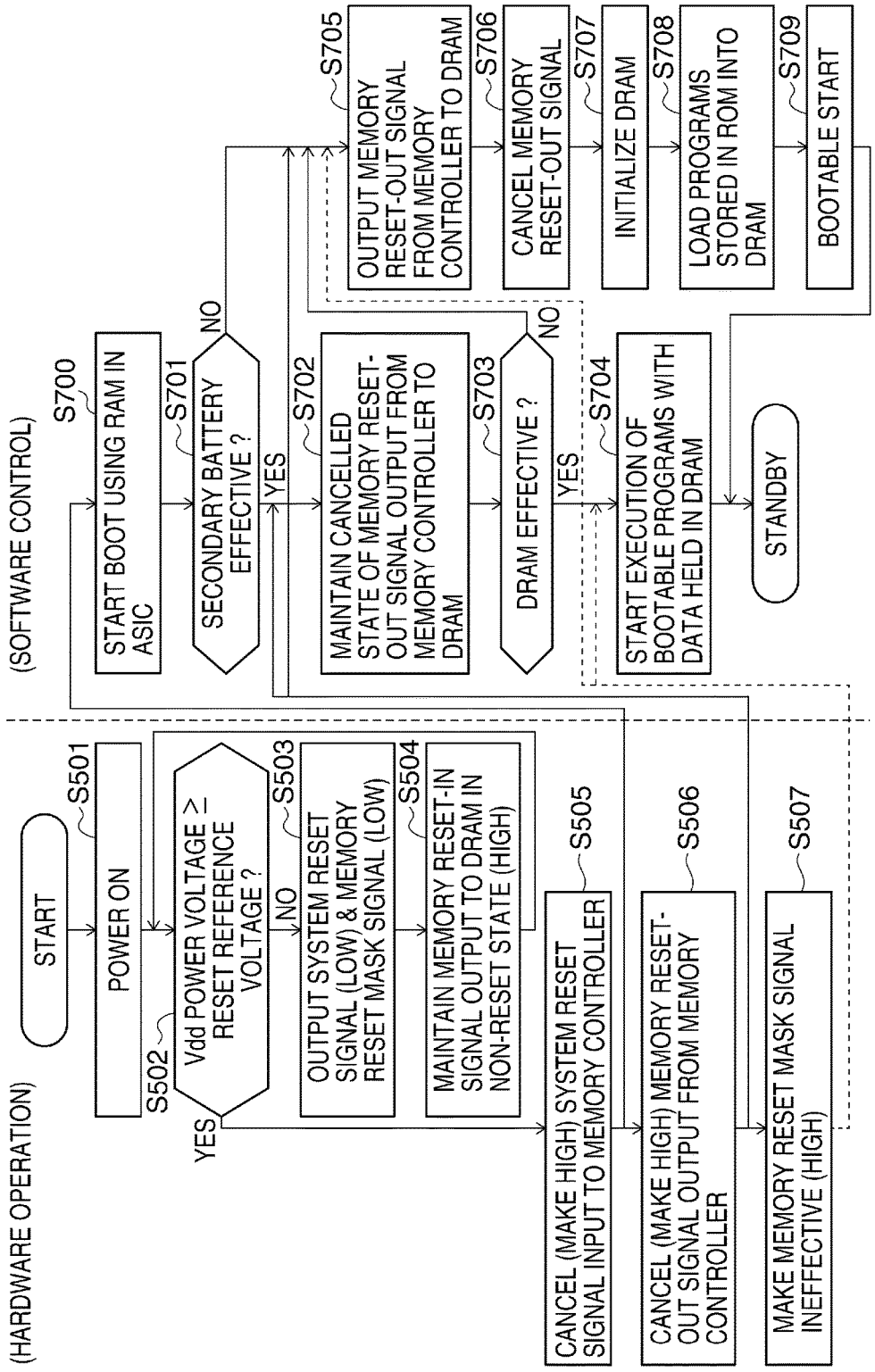

FIG. 6 is a flowchart of a hardware operation sequence and a software control process, performed when the memory control circuit appearing in FIG. 1 is powered on. The software control process of the memory control circuit is performed by the CPU 102 included in the ASIC 101 of the memory control circuit.

Note that in the following description of the conventional example, component elements corresponding to those of the present embodiment are denoted by the same reference numerals, and redundant description is omitted.

First, the power-on/off operation of the conventional example will be described with reference to FIGS. 4A and 5A. When the power supply unit 231 is turned on, the voltage of the Vdd power 201 appearing in FIG. 5A increases, and the voltage of the Vdd_DRAM power 202 also simultaneously increases.

The reset IC 121 monitors the voltage (voltage value) of the Vdd power 201, and if the voltage is lower than a reset reference voltage (lower than a predetermined value), the reset IC 121 outputs a system reset signal 401' at a low level (asserts the same), and when the voltage reaches the reset reference voltage (has become equal to or higher than the predetermined value), the reset IC 121 changes the signal level of the system reset signal 401' from low to high (deasserts the same).

The memory controller 107 maintains the reset state as long as the system reset signal 401' at the low level is input thereto, and when the signal level of the system reset signal 401' is changed from low to high, the memory controller 107 performs an initialization operation in accordance with cancellation of the reset state. Further, the memory controller 107 outputs a memory reset-out signal 402' at a low level (asserts the same) as long as the reset state is maintained, and changes the signal level of the memory reset-out signal 402' from low to high (deasserts the same) when a predetermined delay time t elapses after the signal level of the system reset signal 401' is changed from low to high, and performs the operation for initializing the memory device 113.

Further, in a case where the secondary battery 123 is not connected when the power supply unit 231 is turned off, the voltage of the Vdd power 201 appearing in FIG. 5A decreases, and the voltage of the Vdd_DRAM power 202 also simultaneously decreases. On the other hand, in a case where the secondary battery 123 is connected, even when the voltage of the Vdd power 201 appearing in FIG. 5A decreases, the voltage of the Vdd_DRAM power 202 does not decrease.

In the above-described state, the reset IC 121 monitors the voltage of the Vdd power 201, and when the voltage becomes lower than the reset reference voltage (lower than the predetermined value), the reset IC 121 changes the signal level of the system reset signal 401' from high to low.

When the signal level of the system reset signal 401' is changed from high to low, the memory controller 107 changes the signal level of the memory reset-out signal 402' from high to low.

In a case where the secondary battery 123 is connected, since the voltage of the Vdd_DRAM power 202 does not decrease even when the voltage of the Vdd power 201 appearing in FIG. 5A decreases, the memory device 113 shifts to the self-refresh state. However, since the memory reset-out signal 402' at the low level is output from the memory controller 107, the memory device 113 cannot maintain the self-refresh state, and is reset.

Next, a circuit operation performed when the memory control circuit appearing in FIG. 1 is powered on will be described with reference to FIG. 6, while also referring to FIGS. 4B and 5B.

Referring to FIG. 4B, the gate circuit 130 is a circuit connected between the memory controller 107 and the memory device 113, for masking a memory reset-out signal 402 output from the memory controller 107. When a memory reset mask signal 404 input to the gate circuit 130 from the delay control circuit 131 described hereinafter is ineffective (at a high level), the memory reset-out signal 402 at an input level is output to the memory device 113 via the gate circuit 130 as a memory reset-in signal 403, and when the memory reset mask signal 404 is effective (at a low level), the output from the gate circuit 130 becomes a high impedance state, and is also pulled up by a pull-up resistor, so that the memory reset-out signal 402 at the input level is prevented from being output to the memory device 113. The delay control circuit 131 is a circuit for outputting the memory reset mask signal 404, and causing the memory controller 107 to output the memory reset-out signal 402, according to the trigger signal output from the reset IC 121. When the trigger signal output from the reset IC 121 is in the reset state (at the low level), the delay control circuit 131 immediately outputs the memory reset mask signal 404 and a system reset signal 401, after first setting the memory reset mask signal 404 to the reset state (low level) and then setting the system reset signal 401 to the reset state (low level). When the trigger signal output from the reset IC 121 is changed from the reset state (low level) to a reset-cancelled state (high level), the delay control circuit 131 immediately outputs the system reset signal 401 set to the reset-cancelled state (high level), and outputs the memory reset mask signal 404 set to the reset-cancelled state (high level) after the lapse of a predetermined delay time t'. Note that in this case, similar to the conventional example, the signal level of the memory reset-out signal 402 is changed from low to high when the delay time t which is shorter than the delay time t' elapses. Further, when the trigger signal output from the reset IC 121 is changed from the reset-cancelled state (high level) to the reset state (low level), the delay control circuit 131 immediately outputs the memory reset mask signal 404 set to the reset state (low level), and outputs the system reset signal 401 set to the reset state (low level) after the lapse of a predetermined delay time t".

Referring to FIG. 6, first, when the power supply unit 231 of the image forming apparatus 200 is turned on by a user (step S501), the hardware operation sequence of the memory control circuit is started to supply electric power from the power supply section 122, so that the voltage of the Vdd power 201 appearing in FIG. 5B increases. At this time, if there is no power supplied from the secondary battery 123, when the voltage of the Vdd power 201 increases, the voltage of the Vdd_DRAM power 202 also simultaneously increases. On the other hand, if there is power supplied from the secondary battery 123, the Vdd_DRAM power 202 is in a state already supplied before the power supply unit 231 is turned on.

At the start of supply of electric power from the power supply section 122, the voltage of the Vdd power 201 is lower than the reset reference voltage (NO to a step S502), and hence the reset IC 121 which monitors the voltage of the Vdd power 201 outputs the trigger signal at the low level. In response to the trigger signal at the low level, the delay control circuit 131 outputs the system reset signal 401 and the memory reset mask signal 404 which are made effective (low in the signal level) (step S503). Thus, when the system reset signal 401 at the low level is input from the delay control circuit 131, the inside of the ASIC 101 enter the system reset state, and the memory controller 107 outputs the memory reset-out signal 402 at the low level.

On the other hand, when the memory reset mask signal 404 at the low level is input from the delay control circuit 131, the output from the gate circuit 130 becomes a high impedance state. In this case, if there is electric power supplied from the secondary battery 123, since the output from the gate circuit 130 is pulled up by the Vdd_DRAM power 202, the memory reset-in signal 403 flowing from the output of the gate circuit 130 to the memory device 113 is held in the non-reset state (at the high level) (step S504).

The reset IC 121 continues to monitor the voltage of the Vdd power 201 after that, and when the voltage of the Vdd power 201 reaches the reset reference voltage (YES to the step S502), the reset IC 121 changes the signal level of the trigger signal from low to high. When this change occurs, the system reset signal 401 is immediately changed to the reset-cancelled state (high level) (step S505). When the system reset signal 401 at the high level is output, the system reset state of the ASIC 101 is cancelled. When the system reset state of the ASIC 101 is cancelled, the memory controller 107 cancels the output of the memory reset-out signal 402 at the low level for resetting the memory device 113, i.e. changes the signal level of the memory reset-out signal 402 from low to high after the lapse of the predetermined delay time t (step S506). Further, when the signal level of the trigger signal is changed from low to high, as shown in FIG. 5B, the delay control circuit 131 changes the signal level of the memory reset mask signal 404 from low to high after the lapse of the predetermined delay time t' which is longer than the delay time t, to thereby canceling the masking of the output signal from the gate circuit 130 (step S507). Thus, the hardware operation sequence performed when the power is turned on is terminated.

As described above, by preventing the memory reset-in signal 403 at the low level from being input to the memory device 113, also in a case where the memory controller 107 is restarted from the power-off state, it is possible to maintain the memory device 113 in the self-refresh state.

On the other hand, the software control when the power is turned on is performed in the following manner:

First, in response to the cancellation of the system reset signal 401 in the step S505, the CPU 102 starts a software operation to thereby start execution of a boot program using the internal RAM (step S700). At this time point, the memory controller 107 has not accessed the memory device 113 yet.

Then, the CPU 102 checks whether or not the battery full signal is output from the secondary battery 123 to thereby determine whether the secondary battery 123 is effective or ineffective (step S701). If the secondary battery 123 is effective, the CPU 102 confirms that the signal level of the memory reset-out signal 402 has been changed to high in the step S506, and then maintains the cancelled state (high level) of the memory reset-out signal 402 output from the memory controller 107 to the memory device 113 (step S702).

Next, in a step S703, the CPU 102 checks whether or not the data stored in the memory device 113 is normal, by checking the integrity of the data. If the data stored in the memory device 113 has been normally backed up (YES to the step S703), the CPU 102 starts execution of a bootable program using the data stored in the memory device 113 (step S704). In this case, the reset-cancelled state of the memory reset-out signal 402 is maintained. Note that the software control process of the memory control circuit is performed by the CPU 102 of the ASIC 101, and hence it is impossible to check in the software control process whether or not the signal level of the memory reset mask signal 404, which is not input to the ASIC 101, has been changed to high in the step S507. However, the timing control is performed in the software control process such that the step S507 is terminated before the start of the step S704. This makes it possible to positively start execution of the bootable program in the step S704.

On the other hand, if it is known, as a result of checking whether or not the battery full signal is output, that the secondary battery 123 is ineffective (NO to the step S701), or if the integrity of the data stored in the memory device 113 has not been preserved (NO to the step S703), the CPU 102 confirms that the memory reset-out signal 402 has been changed to high in the step S506, and thereafter, in a step S705, the memory reset-out signal 402 changed to the reset state (low level) is output from the memory controller 107 to the memory device 113. When the predetermined time period elapses after this output of the memory reset-out signal 402, the memory reset-out signal 402 is changed to the cancelled state (high level) (step S706), and the memory device 113 is initialized (step S707). As described above, since the software control process of the memory control circuit is performed by the CPU 102 of the ASIC 101, it is impossible to check in the software control process whether or not the signal level of the memory reset mask signal 404, which is not input to the ASIC 101, has been changed to high in the step S507. However, the timing control is performed in the software control process such that the step S507 is terminated before the start of the step S705. This makes it possible to positively confirm in the software control process immediately before the step S705 that the signal level of the memory reset-out signal 402 has been changed to high in the step S506.

Next, the programs stored in the NOR ROM 111 are loaded into the memory device 113 (step S708), and execution of the bootable program is started on the memory device 113 (step S709). Thus, the software control process performed when the power is turned on is terminated.

Next, the hardware control performed when the power is turned off will be described with reference to FIGS. 4B and 5B using a flowchart in FIG. 7.

Figure 7:
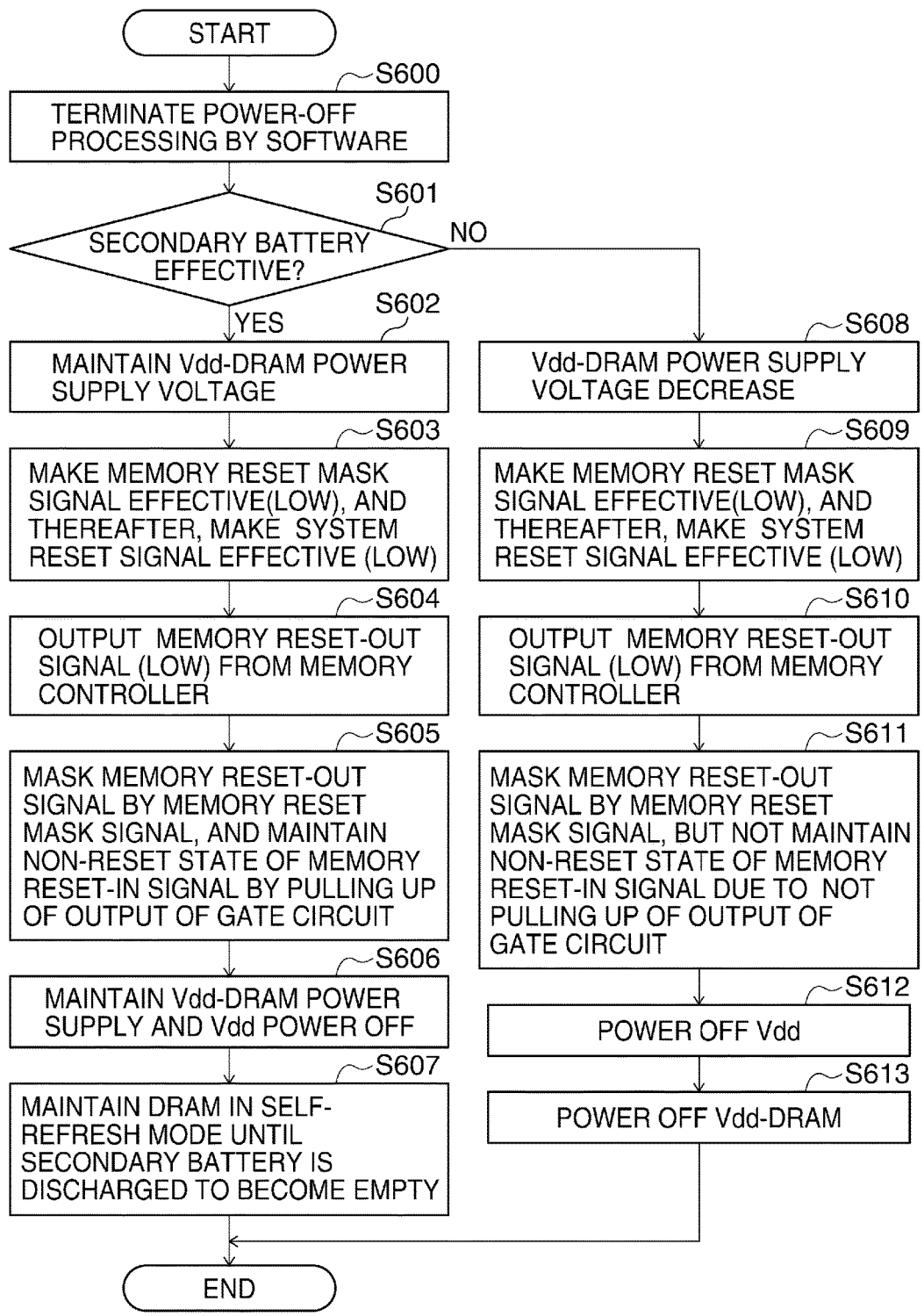
FIG. 7 is a flowchart of a hardware operation sequence performed when the memory control circuit appearing in FIG. 1 is powered off.

FIG. 7 is a flowchart of a hardware operation sequence performed when the memory control circuit appearing in FIG. 1 is powered off.

Referring to FIG. 7, when a software control process, which will be described hereinafter with reference to FIG. 8, performed when the power is turned on is terminated in response to a power-off operation (step S600), the hardware operation sequence performed when the power is turned off is started.

In a step S601, the CPU 102 determines whether the secondary battery 123 is effective or ineffective. If it is determined in the step S601 that the secondary battery 123 is effective (YES to the step S601), even when the voltage of the Vdd power 201 decreases due to the power-off operation, the voltage of the Vdd_DRAM power 202 is maintained (step S602). After that, at a time point when the voltage of the Vdd power 201 decreases to the reset reference voltage, the reset IC 121 outputs the trigger signal at the low level to the delay control circuit 131. In response to the trigger signal at the low level, the delay control circuit 131 inputs the memory reset mask signal 404, which is made effective (low in the signal level), to the gate circuit 130, and then inputs the system reset signal 401, which is set to the reset state (low level) to the ASIC 101 and the memory controller 107 inside the ASIC 101 after the lapse of the delay time t″, as shown in FIG. 5B (step S603).

Here, in a case where a step S805 in FIG. 8, described hereinafter, has not been normally terminated due to a trouble, as shown in FIG. 5B, when the system reset signal 401 at the low level is input to the memory controller 107, the memory controller 107 immediately changes the signal level of the memory reset-out signal 402, which is being output, from high to low (step S604). However, even in this case, the memory reset-out signal 402 at the low level, which is output from the memory controller 107 to the memory device 113 at this time, can be positively masked by the gate circuit 130 which is in a state closed by the memory reset mask signal 404 at the low level which has been input in the step S602.

On the other hand, in a case where the step S805 has been normally terminated, even when the system reset signal 401 at the low level is input to the memory controller 107, the signal level of the memory reset-out signal 402 is not changed to low in the step S604, but is maintained high by the software control in the step S805. This makes it possible to prevent the memory reset-in signal 403 at the low level from being input to the memory device 113 during power-off processing.

Note that irrespective of whether or not the step S805 has been normally terminated, the gate circuit 130 is in the state closed by the memory reset mask signal 404 at the low level, and also the secondary battery 123 is in the effective state, causing the output of the gate circuit 130 to be pulled up, and hence the signal level of the memory reset-in signal 403 is held in the non-reset state (at the high level) (step S605).

After that, in the step S605, the Vdd power 201 is turned off while maintaining the supply of the Vdd-DRAM power 202 (step S606), and the memory device 113 is maintained in the self-refresh mode until the secondary battery 123 is discharged and becomes empty (step S607).

On the other hand, if it is determined in the step S601 that the secondary battery 123 is ineffective (NO to the step S601), as the voltage of the Vdd power 201 decreases, the voltage of the Vdd_DRAM power 202 also simultaneously decreases (step S608). After that, when the voltage of the Vdd power 201 decreases to the reset reference voltage, the reset IC 121 outputs the trigger signal at the low level to the delay control circuit 131. In response to the trigger signal at the low level, the delay control circuit 131 inputs the memory reset mask signal 404 made effective (low in the signal level) to the gate circuit 130, then changes the signal level of the system reset signal 401 to low after the lapse of the delay time t″ (step S609), as shown in FIG. 5B, and inputs the system reset signal 401 at the low level to the ASIC 101 and the memory controller 107 inside the ASIC 101. When the system reset signal 401 at the low level is input to the memory controller 107, the memory controller 107 immediately changes the signal level of the memory reset-out signal 402, which is being output, from high to low (step S604).

At this time, although the memory reset-out signal 402 at the low level is masked because the gate circuit 130 is in the state closed by the memory reset mask signal 404 at the low level, the output of the gate circuit 130 is not pulled up because the secondary battery 123 is in the ineffective state, and hence the memory reset-in signal 403 is not maintained in the non-reset state (step S611). Thereafter, when the Vdd power 201 is turned off (step S612), the Vdd_DRAM power 202 is also turned off (step S613), followed by terminating the present process.

Figure 8:
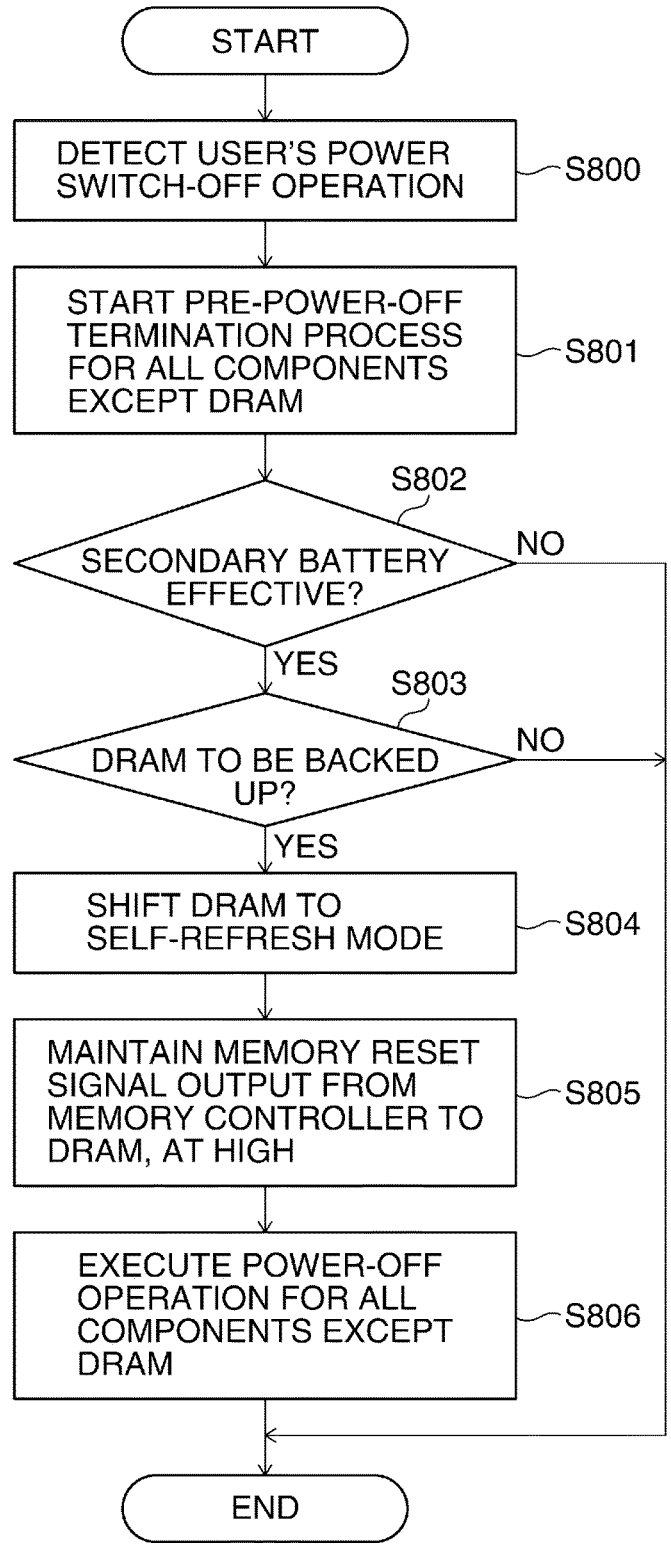
FIG. 8 is a flowchart of a software control process performed when the memory control circuit appearing in FIG. 1 is powered off.

FIG. 8 is a flowchart of a software control process performed when the memory control circuit appearing in FIG. 1 is powered off. Similar to the process in FIG. 6, the software control process of the memory control circuit is performed by the CPU 102 included in the ASIC 101 of the memory control circuit.

When a power-off operation performed by the user is detected (step S800), the CPU 102 starts pre-power-off termination processing, such as data saving, required to be performed before turning off the power, for all of components that can be controlled by the ASIC 101, except the memory device 113 (step S801).

Next, in a step S802, the CPU 102 determines whether the secondary battery 123 is effective (in a connected and sufficiently charged state) or ineffective (in a disconnected or insufficiently charged state). If it is determined in the step S802 that the secondary battery 123 is effective (YES to the step S802), the CPU 102 determines whether or not to back up the memory device 113 in a state in which the main power supply is off (step S803). For example, in a case where the setting is made such that the apparatus is started in a high-speed start mode at the next power-on operation, or in a case where the setting is made such that log data and the like stored in the memory device 113 is to be preserved, it is determined in the step S803 that the memory device 113 is to be backed up.

If it is determined in the step S803 that the memory device 113 is to be backed up (YES to the step S803), the CPU 102 shifts the memory device 113 to the self-refresh mode (step S804). Then, the CPU 102 controls the memory controller 107 not to output the memory reset-out signal 402 at the low level from the memory controller 107 to the memory device 113, i.e. controls the memory controller 107 to maintain the memory reset-out signal 402 at the high level (step S805: an operation of a suspension unit). Next, when the power-off operation is performed for all of the components which can be controlled by the ASIC 101 except the memory device 113 (step S806), the present process is terminated. After this software control process is terminated, the process shifts to the above-described hardware operation process in FIG. 7, performed when the power is turned off.

On the other hand, if it is determined in the step S802 that the secondary battery 123 is ineffective (NO to the step S802), or if it is determined in the step S803 that the memory device 113 is not to be backed up (NO to the step S803), the present process is immediately terminated, and the process shifts to the above-described hardware operation process in FIG. 7, performed when the power is turned off.

Figure 9:
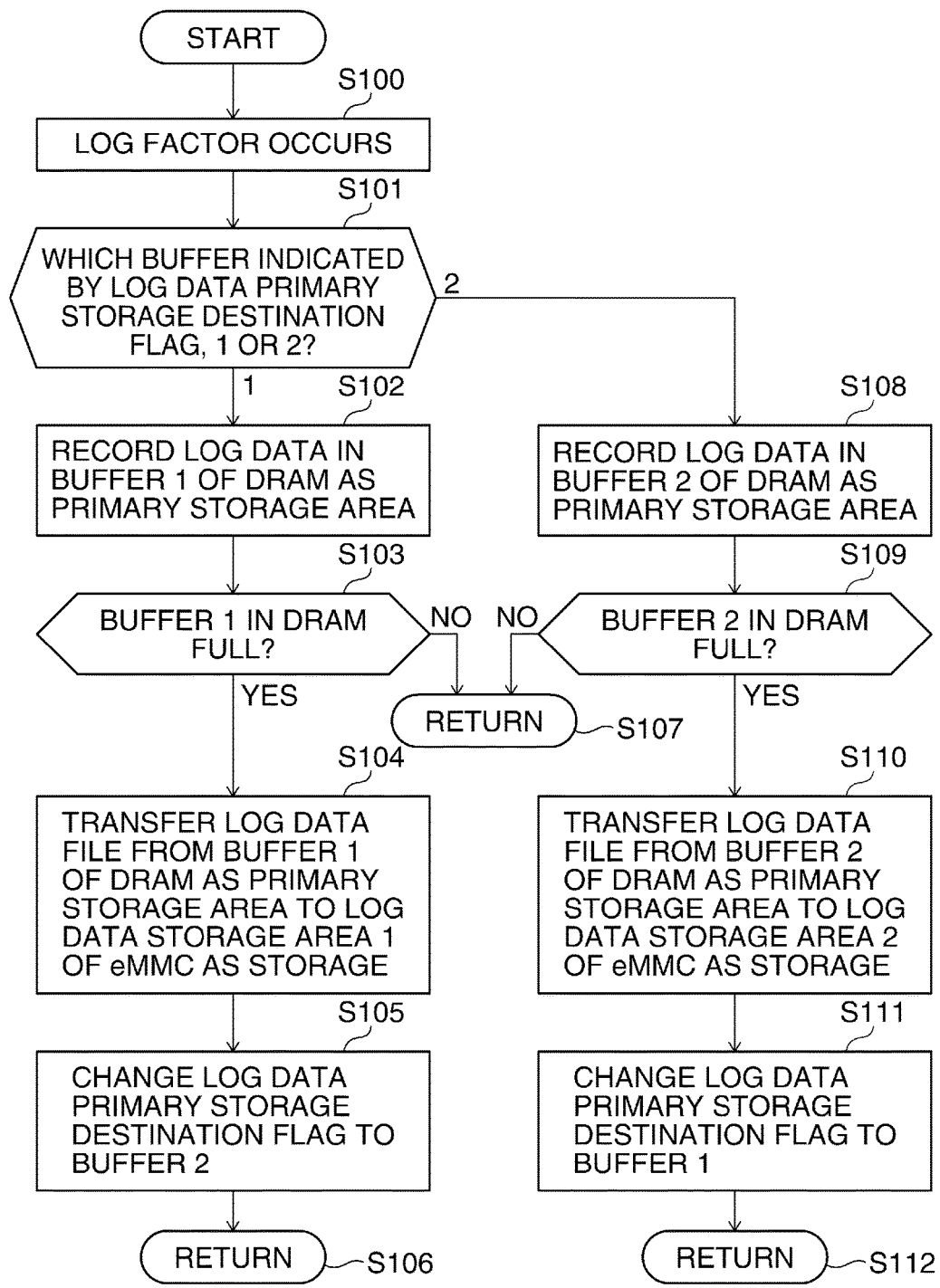
FIG. 9 is a flowchart of a process for recording log data which is held in a memory device, performed by the software of the memory control circuit appearing in FIG. 1.

FIG. 9 is a flowchart of a process performed by the software of the memory control circuit appearing in FIG. 1, for recording log data stored in the memory device 113.

If a log factor (an event requiring recording of log data) occurs during execution of a program (step S100), the process proceeds to a step S101, wherein the CPU 102 checks which one of the buffer 113a (buffer 1 in FIG. 2) and the buffer 113b (buffer 2 in FIG. 2) is indicated by a log data primary storage destination flag indicative of a log data storage destination in the memory device 113 which is an area for temporarily storing the log data.

If it is confirmed in the step S101 that the log data primary storage destination flag indicates the buffer 113a (buffer 1 in FIG. 2), the process proceeds to a step S102, wherein the log data is recorded in the buffer 113a (buffer 1 in FIG. 2) of the memory device 113.

Next, in a step S103, the CPU 102 determines whether or not the buffer 113a (buffer 1 in FIG. 2) of the memory device 113 is full. If it is determined in the step S103 that the buffer 113a (buffer 1 in FIG. 2) of the memory device 113 is not full (NO to the step S103), the process proceeds to a step S107 to return. On the other hand, if it is determined in the step S103 that the buffer 1 in the DRAM is full (YES to the step S103), the log data is transferred from the buffer 1 of the memory device 113 to the log data storage area 112a (also denoted as log data 1 in FIG. 2) of the eMMC 112 as the storage (step S104). Next, in a step S105, the log data primary storage destination flag is changed to the buffer 113b (buffer 2 in FIG. 2), and the process proceeds to a step S106 to return.

On the other hand, if it is determined in the step S101 that the log data primary storage destination flag indicates the buffer 113b (buffer 2 in FIG. 2), the process proceeds to a step S108, wherein the log data is recorded in the buffer 113b (buffer 2 in FIG. 2) of the memory device 113.

Next, in a step S109, the CPU 102 determines whether or not the buffer 113b (buffer 2 in FIG. 2) of the memory device 113 is full. If it is determined in the step S109 that the buffer 113b (buffer 2 in FIG. 2) of the memory device 113 is not full (NO to the step S109), the process proceeds to the step S107 to return. On the other hand, if it is determined in the step S109 that the buffer 113b (buffer 2 in FIG. 2) of the memory device 113 is full (YES to the step S109), the log data is transferred from the buffer 113b (buffer 2 in FIG. 2) of the memory device 113 to the log data storage area 112b (also denoted as log data 2 in FIG. 2) of the eMMC 112 as the storage (step S110). Next, in a step S111, the log data primary storage destination flag is changed to the buffer 113a (buffer 1 in FIG. 2), the process proceeds to a step S112 to return.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-167004 filed Aug. 26, 2015, which is hereby incorporated by reference herein in its entirety.

What is claimed is:

1. A memory control circuit including a memory controller that performs data memory reset processing including deleting data held in a volatile memory that operates when electric power is being supplied from a first power supply, by changing a memory reset signal which is effective, after a voltage value of a second power supply becomes equal to or higher than a predetermined value, comprising:

a mask circuit that is provided between the volatile memory and the memory controller, for masking the memory reset signal when a mask signal which is effective is input;

a determination unit configured to determine whether or not to keep the data, in a case where an event occurs which makes the voltage value of the second power supply lower than the predetermined value, and also the first power supply is on; and an output control circuit configured to, in a case where it is determined by said determination unit that the data is to be kept, cause said mask circuit to mask the memory reset signal, by outputting the mask signal made effective to said mask circuit.

2. The memory control circuit according to claim 1, further comprising a trigger circuit configured to monitor the voltage value of the second power supply supplied to the memory controller, and outputting an effective/ineffective trigger signal to said output control circuit according to the monitored voltage value of the second power supply in a changeable manner, and wherein when the voltage value of the second power supply becomes lower than the predetermined value, said trigger circuit changes the trigger signal from an ineffective trigger signal to an effective trigger signal, and outputs the effective trigger signal to said output control circuit, wherein after the trigger signal output from said trigger circuit is changed, said output control circuit changes, at a first timing, the mask signal from an ineffective mask signal to an effective mask signal and outputs the effective mask signal to said mask circuit, and changes, at a second timing which is later than the first timing, a system reset signal from an ineffective system reset signal to an effective system reset signal and outputs the effective system reset signal to the memory controller, and wherein when the system reset signal output from said output control circuit is changed, the memory controller changes the memory reset signal from an ineffective memory reset signal to the effective memory reset signal and outputs the effective memory reset signal.

3. The memory control circuit according to claim 1, wherein said mask circuit is provided with a pull-up resistor pulled up by the first power supply, on an output side thereof.

4. The memory control circuit according to claim 1, further comprising a restoration unit, wherein:

the output control circuit is further configured to output the mask signal which is effective to said mask circuit during a time in which the voltage value of the second power supply does not reach the predetermined value after the second power supply is turned on; and the restoration unit is configured to cause the operation of the memory control circuit to be restored using the data, in a case where the first power supply is on when the voltage value of the second power supply becomes equal to or higher than the predetermined value after the second power supply is turned on.

5. The memory control circuit according to claim 4, further comprising a trigger circuit configured to monitor the voltage value of the second power supply supplied to the memory controller, and output an effective/ineffective trigger signal to said output control circuit according to the monitored voltage value of the second power supply in a changeable manner, and wherein when the voltage value of the second power supply becomes equal to or higher than the predetermined value, said trigger circuit changes the trigger signal from an effective trigger signal to an ineffective trigger signal, and outputs the ineffective trigger signal to said output control circuit, wherein after the trigger signal output from said trigger circuit is changed, said output control circuit changes, at a first timing, a system reset signal from an effective system reset signal to an ineffective system reset signal and outputs the ineffective system reset signal to the memory controller, and also changes, at a second timing which is later than the first timing, the mask signal from the effective mask signal to an ineffective mask signal and outputs the ineffective mask signal to said mask circuit, and wherein after the system reset signal output from said output control circuit is changed, the memory controller changes, at a third timing earlier than the second timing, the memory reset signal from the effective memory reset signal to an ineffective memory reset signal and outputs the ineffective memory reset signal.

6. A method of controlling a memory control circuit including a memory controller that performs data memory reset processing including deleting data held in a volatile memory that operates when electric power is being supplied from a first power supply, by changing a memory reset signal which is effective, after a voltage value of a second power supply becomes equal to or higher a predetermined value, comprising:

masking the memory reset signal when a mask signal which is effective is generated;

determining whether or not to keep the data, in a case where an event occurs which makes the voltage value of the second power supply lower than the predetermined value, and also the first power supply is on; and masking the memory reset signal by making the mask signal effective in a case where it is determined that the data is to be kept.

7. The method according to claim 6, further comprising monitoring the voltage value of the second power supply supplied to the memory controller, and outputting an effective/ineffective trigger signal according to the monitored voltage value of the second power supply in a changeable manner;

changing the trigger signal from an ineffective trigger signal to an effective trigger signal, when the voltage value of the second power supply becomes lower than the predetermined value;

changing, after the trigger signal is changed, at a first timing, the mask signal from an ineffective mask signal to an effective mask signal, and changing, at a second timing which is later than the first timing, a system reset signal from an ineffective system reset signal to an effective system reset signal and outputting the effective system reset signal to the memory controller; and causing, when the system reset signal is changed, the memory controller to change the memory reset signal from an ineffective memory reset signal to the effective memory reset signal and output the effective memory reset signal.

8. The method according to claim 6, wherein the memory control circuit includes a mask circuit that is provided with a pull-up resistor pulled up by the first power supply, on an output side thereof, and performs masking of the memory reset signal.

9. The method according to claim 6, further comprising:

generating the mask signal which is effective for masking the memory reset signal, during a time in which the voltage value of the second power supply does not reach the predetermined value after the second power supply is turned on; and causing the operation of the memory control circuit to be restored using the data, in a case where the first power supply is on when the voltage value of the second power supply becomes equal to or higher than the predetermined value after the second power supply is turned on.

10. The method according to claim 9, further comprising monitoring the voltage value of the second power supply supplied to the memory controller, and outputting an effective/ineffective trigger signal according to the monitored voltage value of the second power supply in a changeable manner;

changing, when the voltage value of the second power supply becomes equal to or higher than the predetermined value, the trigger signal from an effective trigger signal to an ineffective trigger signal;

changing, after the trigger signal is changed, at a first timing, a system reset signal from an effective system reset signal to an ineffective system reset signal and outputting the ineffective system reset signal to the memory controller, and also changing, at a second timing which is later than the first timing, the mask signal from the effective mask signal to an ineffective mask signal; and causing, after the system reset signal is changed, the memory controller to change, at a third timing earlier than the second timing, the memory reset signal from the effective memory reset signal to an ineffective memory reset signal and output the ineffective memory reset signal.

* * * * *